(12) United States Patent
Park

(10) Patent No.: US 7,095,171 B2
(45) Date of Patent: Aug. 22, 2006

(54) ACTIVE MATRIX ORGANIC ELECTROLUMINESCENT DEVICE AND FABRICATING METHOD THEREOF

(75) Inventor: Jae-Yong Park, Annyang-si (KR)

(73) Assignee: LG.Philips LCD Co., Ltd., Seoul (KR)

(*) Notice: Subject to any disclaimer, the term of this patent is extended or adjusted under 35 U.S.C. 154(b) by 107 days.

(21) Appl. No.: 10/876,641

(22) Filed: Jun. 28, 2004

(65) Prior Publication Data

US 2005/0140302 A1    Jun. 30, 2005

(30) Foreign Application Priority Data

Dec. 30, 2003    (KR) ............... 10-2003-0100669

(51) Int. Cl.
*H01J 1/62* (2006.01)
*H01J 63/04* (2006.01)
*G09G 3/10* (2006.01)

(52) U.S. Cl. ............... 313/506; 313/505; 313/503; 313/498; 345/92; 345/91; 345/82; 315/169.3

(58) Field of Classification Search ............... None
See application file for complete search history.

(56) References Cited

U.S. PATENT DOCUMENTS

| | | |
|---|---|---|
| 5,276,380 A | 1/1994 | Tang |
| 5,294,869 A | 3/1994 | Tang et al. |
| 5,294,870 A | 3/1994 | Tang et al. |
| 5,701,055 A | 12/1997 | Nagayama et al. |
| 5,742,129 A | 4/1998 | Nagayama et al. |
| 5,952,037 A | 9/1999 | Nagayama et al. |
| 6,046,547 A | 4/2000 | Nishio et al. |
| 6,175,345 B1 | 1/2001 | Kuribayashi et al. |
| 6,373,455 B1 | 4/2002 | Kuribayashi et al. |
| 6,960,787 B1 * | 11/2005 | Yamazaki et al. ............ 257/59 |

* cited by examiner

*Primary Examiner*—Tuyet Thi Vo
(74) *Attorney, Agent, or Firm*—McKenna Long & Aldridge LLP

(57) ABSTRACT

An organic electroluminescent device includes a gate line and a data line on a substrate, the data line crossing the gate line; a switching element connected to the gate line and the data line; a driving element having a plurality of thin film transistors interconnected in parallel, the driving element being connected to the switching element; and an organic electroluminescent diode connected to the driving element, wherein the driving element includes first and second gate electrodes, an active layer over the first and second gate electrodes, a drain electrode between the first and second gate electrodes, and a source electrode substantially surrounding the drain electrode.

32 Claims, 16 Drawing Sheets

ACTIVE MATRIX ORGANIC ELECTROLUMINESCENT DEVICE AND FABRICATING METHOD THEREOF

The present invention claims the benefit of the Korean Patent Application No. 2003-100669 filed in Korea on Dec. 30, 2003, which is hereby incorporated by reference for all purposes as if fully set forth herein.

BACKGROUND OF THE INVENTION

1. Field of the Invention

The present invention relates to an organic electroluminescent device, and more particularly, to an active matrix organic electroluminescent device including a driving element having a plurality of thin film transistors interconnected in parallel and a fabricating method thereof.

2. Discussion of the Related Art

In general, an organic electroluminescent device (ELD) emits light by injecting electrons from a cathode and holes from an anode into an emission layer, combining the electrons with the holes, generating an exciton, and transitioning the exciton from an excited state to a ground state. Compared to a liquid crystal display (LCD) device, an additional light source is not necessary for the organic ELD to emit light because the transition of the exciton between the two states causes light to be emitted. Accordingly, the size and weight of the organic ELD can be reduced. The organic ELD has other excellent characteristics such as low power consumption, superior brightness, and fast response time. Because of these characteristics, the organic. ELD is regarded as a promising display for next-generation consumer electronic applications such as cellular phones, car navigation system (CNS), personal digital assistants (PDA), camcorders, and palmtop computers. Moreover, since fabricating the organic ELD is a simple process with a few processing steps, it is much cheaper to produce an organic ELD than an LCD device.

Two different types of organic ELDs exist: passive matrix and active matrix. While both the passive matrix organic ELD and the active matrix organic ELD have a simple structure and are formed by a simple fabricating process, the passive matrix organic ELD requires a relatively high amount of power to operate. In addition, the display size of a passive matrix organic ELD is limited by its structure. Furthermore, as the number of conductive lines increases, the aperture ratio of a passive matrix organic ELD decreases. In contrast, active matrix organic. ELDs are highly efficient and can produce a high-quality image for a large display with a relatively low power.

FIG. 1 is a schematic cross-sectional view of an organic ELD according to a related art. In FIG. 1, an array element 14 including a thin film transistor (TFT) "T" is formed on a first substrate 12. A first electrode 16, an organic electroluminescent layer 18, and a second electrode 20 are formed over the array element 14. The organic electroluminescent layer 18 may separately display red, green, and blue colors for each pixel region. A second substrate 28 faces the first substrate 12 and is spaced apart from the first substrate 12.

The first and the second substrates 12 and 28 are attached to each other with a sealant 26. The organic ELD is encapsulated by attaching the first substrate 12 to the second substrate 28. The second substrate 28 includes a moisture absorbent material 22 to eliminate moisture and oxygen that may penetrate into a capsule of the organic electroluminescent layer 18. After etching a portion of the second substrate 28, the etched portion is filled with the moisture absorbent material 22 and the filled moisture absorbent material is fixed by a holding element 25.

FIG. 2 is an equivalent circuit diagram of the organic electroluminescent device according to the related art. In FIG. 2, a gate line 36 crosses a data line 49, and a switching element "$T_S$" at a crossing of the gate line 36 and the data line 49 is connected to the gate line 36 and the data line 49. A driving element "$T_D$" electrically connects the switching element "$T_S$" to an organic electroluminescent diode "$D_{EL}$." A storage capacitor "$C_{ST}$" is formed between a driving gate electrode 34 and a driving source electrode 52 of the driving element "$T_D$" as the driving element "$T_D$" is a positive type transistor. The organic electroluminescent diode "$D_{EL}$" is connected to a power line 62, and the driving drain electrode may be connected to an anode of the organic electroluminescent diode "$D_{EL}$."

When a scan signal of the gate line 36 is applied to a switching gate electrode 32 of the switching element "$T_S$" an image signal of the data line 49 is applied to the driving gate electrode 34 of the driving element "$T_D$" through the switching element "$T_S$." The current density of the driving element "$T_D$" is modulated by the image signal applied to the driving gate electrode 34. As a result, the organic electroluminescent diode "$D_{EL}$" can display images with gray scale levels. Moreover, because the image signal stored in the storage capacitor "$C_{ST}$" is applied to the driving gate electrode 34, the current density flowing into the organic electroluminescent diode "$D_{EL}$" is uniformly maintained until the next image signal is applied, even when the switching element "$T_S$" is turned off. The switching element "$T_S$" and the driving element "$T_D$" can be a polycrystalline silicon TFT or an amorphous silicon TFT. The process of fabricating an amorphous silicon TFT is simpler than the process for a polycrystalline silicon TFT.

FIG. 3 is a schematic cross-sectional view illustrating a switching element and a driving element including an amorphous TFT for one pixel region of an organic electroluminescent device according to the related art. In FIG. 3, a gate line 36 is formed on a substrate 30 in a first direction, a data line 49 crosses the gate line 36 in a second direction, and a power line 62 is arranged in parallel to the data line 49 and crosses the gate line 36. A pixel region "P" is defined by the gate, data and power lines 36, 49 and 62. A switching element "$T_S$" adjacent to the pixel region "P" is connected to the gate and data lines 36 and 49. A driving element "$T_D$" is connected to the switching element "$T_S$." In addition, the switching element "$T_S$" includes switching gate electrode 32, switching active layer 56a, switching source electrode and drain electrode 48 and 50. The driving element "$T_D$" includes a driving gate electrode 34, a driving active layer 58a, a driving source electrode 52 and a driving drain electrode 54. Specifically, the driving gate electrode 34 is connected to the switching drain electrode 50, the driving source electrode 52 is connected to the power line 62, and the driving drain electrode 54 is connected to the organic electroluminescent diode "$D_{EL}$". (of FIG. 2). The switching active layer 56a and the driving active layer 58a may be formed of amorphous silicon.

The amorphous silicon driving TFT should have a large width to length ratio (W/L ratio) in order to drive the organic electroluminescent diode "$D_{EL}$" (of FIG. 2). In this case, a size of the driving element "$T_D$" is much larger than a size of the switching element "$T_S$."

FIGS. 4A and 4B are schematic cross-sectional views taken along the lines "IVa—IVa" and "IVb—IVb" in FIG. 3, respectively.

In FIGS. 4A and 4B, a switching gate electrode 32 and a driving gate electrode 34 connected to the switching gate electrode 32 are formed on a substrate 30. Although not shown in FIGS. 4A and 4B, a gate line is formed on the substrate 30 in a first direction and connected to the switching gate electrode 32. A gate-insulating layer 38 is formed over the substrate 30 including the switching gate electrode 32 and the driving gate electrode 34. A switching semi-conductor layer 56, and a driving semi-conductor layer 58 are formed over the switching gate electrode 32 and the driving gate electrode 34, respectively. The switching semi-conductor layer 56 has an island isolated shape and includes a switching active layer 56a and a switching ohmic contact layer 56b. In addition, the driving semi-conductor layer 58 also has an island isolated shape and includes a driving active layer 58a and a driving ohmic contact layer 58b.

Switching source and drain electrodes 48 and 50, and driving source and drain electrodes 52 and 54 are formed on the switching semi-conductor layer 56 and driving semi-conductor layer 58, respectively. Specifically, the switching source and drain electrodes 48 and 50, and the driving source and drain electrodes 52 and 54 contact the switching ohmic contact layer 56b and the driving ohmic contact layer 58b, respectively. In addition, the driving gate electrode 34 is connected to the switching drain electrode 50. A first passivation layer 60 is formed over the substrate 30 including the switching source and drain electrodes 48 and 50, and the driving source and drain electrodes 52 and 54. A power line 62 is formed on the first passivation layer 60 and connected to the driving source electrode 52. A second passivation layer 64 is formed over the substrate 30 including the power line 62, and a first electrode 66 is formed on the second passivation layer 64 in the pixel region "P" and is connected to the driving drain electrode 54.

The driving active layer 58a of the organic electroluminescent device according to the related art has a large value of width to length ratio (W/L ratio) in order to provide the organic electroluminescent diode with enough currents, which affects the aperture ratio adversely. Moreover, because current stress increases as the current density increases, thermalization of the driving TFT may occur. Furthermore, because direct current (DC) biases are constantly applied to the driving element, operational properties of the driving element varies. Accordingly, an active matrix organic electroluminescent device having such an amorphous silicon TFT has a poor image quality such as residual image, and the poor operational properties of the driving element lead to point defects in the active matrix organic ELD.

Meanwhile, when an array element layer of TFTs and an organic EL diode are formed together on one substrate, the production yield of an organic ELD is determined by a multiplication of the yield of the array element and the yield of the organic EL diode. Since the yield of the organic EL diode is relatively low, the production yield of an organic ELD is limited by the yield of the organic EL diode. For example, even when TFTs are well fabricated, an organic. ELD can be determined to be defective due to a defect of an organic emission layer of a thin film of about 1000 Å thickness. This results in loss of materials and high production cost.

Organic ELDs are classified into a bottom emission type and a top emission type according to transparency of the first and second electrodes of the organic EL diode. The bottom emission type ELDs have advantages such as high image stability and various fabrication processes due to encapsulation. However, the bottom emission type organic ELDs are not adequate for devices requiring a high resolution due to the limitations in aperture ratio. On the other hand, since the top emission type organic. ELDs emit light in a direction upward of the substrate, light emits without influence of the array element layer that is positioned under the organic EL layer. Accordingly, the overall design of the array layer including TFTs may be simplified. In addition, the aperture ratio can be increased, thereby increasing operational life span of the organic ELDs. However, because the top emission type organic. ELDs have a cathode commonly formed over the organic EL layer, material selection is limited so that light transmission efficiency is lowered. When a thin film type passivation layer is formed to prevent the reduction of light transmittance, the thin film type passivation layer may fail to prevent infiltration of exterior air into the device.

SUMMARY OF THE INVENTION

Accordingly, the present invention is directed to an organic electroluminescent device and a fabricating method thereof that substantially obviate one or more of the problems due to limitations and disadvantages of the related art.

An advantage of the present invention is to provide an organic electroluminescent device where a plurality of thin film transistors are interconnected in parallel, and a fabricating method thereof.

Another advantage of the present invention is to provide an active matrix organic electroluminescent device with a high display quality and a fabricating method thereof.

Another advantage of the present invention is to increase a width to length ratio (W/L ratio) of a driving element without sacrificing aperture ratio, thereby stabilizing the driving element.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device includes a gate line and a data line on a substrate, the data line crossing the gate line; a switching element connected to the gate line and the data line; a driving element having a plurality of thin film transistors interconnected in parallel, the driving element being connected to the switching element; and an organic electroluminescent diode connected to the driving element, wherein the driving element includes first and second gate electrodes, an active layer over the first and second gate electrodes, a drain electrode between the first and second gate electrodes, and a source electrode substantially surrounding the drain electrode.

In another aspect, an organic electroluminescent device includes first and second substrates facing each other and spaced apart from each other; a gate line and a data line on the first substrate, the data line crossing the gate line; a switching element connected to the gate line and the data line; a driving element having a plurality of thin film transistors interconnected in parallel, the driving element being connected to the switching element; an organic electroluminescent diode on the second substrate; and a connection electrode electrically connecting the first substrate to the second substrate, wherein the driving element includes first and second gate electrodes, an active layer over the first and second gate electrodes, a drain electrode between the first and second gate electrodes; and a source electrode substantially surrounding the drain electrode.

In another aspect, a method of fabricating an organic electroluminescent device includes forming a gate line on a substrate; forming a switching element connected to the gate line; forming a driving element connected to the switching element, the driving element having a plurality of thin film transistors interconnected in parallel; forming a data line, the data line crossing the gate line and connected to the switching element; and forming an organic electroluminescent diode connected to the driving element, wherein forming the driving element having the plurality of the thin film transistors includes forming first and second gate electrodes; forming an active layer over the first and second gate electrodes; forming a drain electrode between the first and second gate electrodes; and forming a source electrode substantially surrounding the drain electrode.

Yet, in another aspect, a driving system for an organic electroluminescent device includes first and second gate electrodes facing each other and spaced apart from each other; an active layer over the first and second gate electrodes; a drain electrode between the first and second gate electrodes; and a source electrode, the source electrode substantially surrounding the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 1:
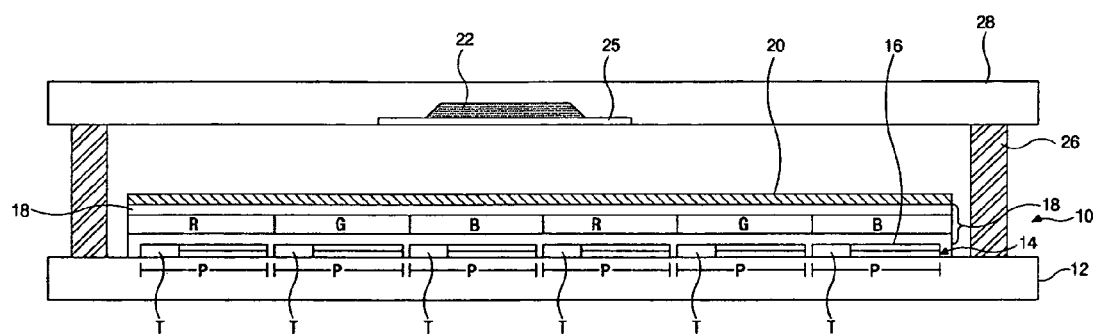
FIG. 1 is a schematic cross-sectional view of an organic ELD according to a related art.
Figure 2:
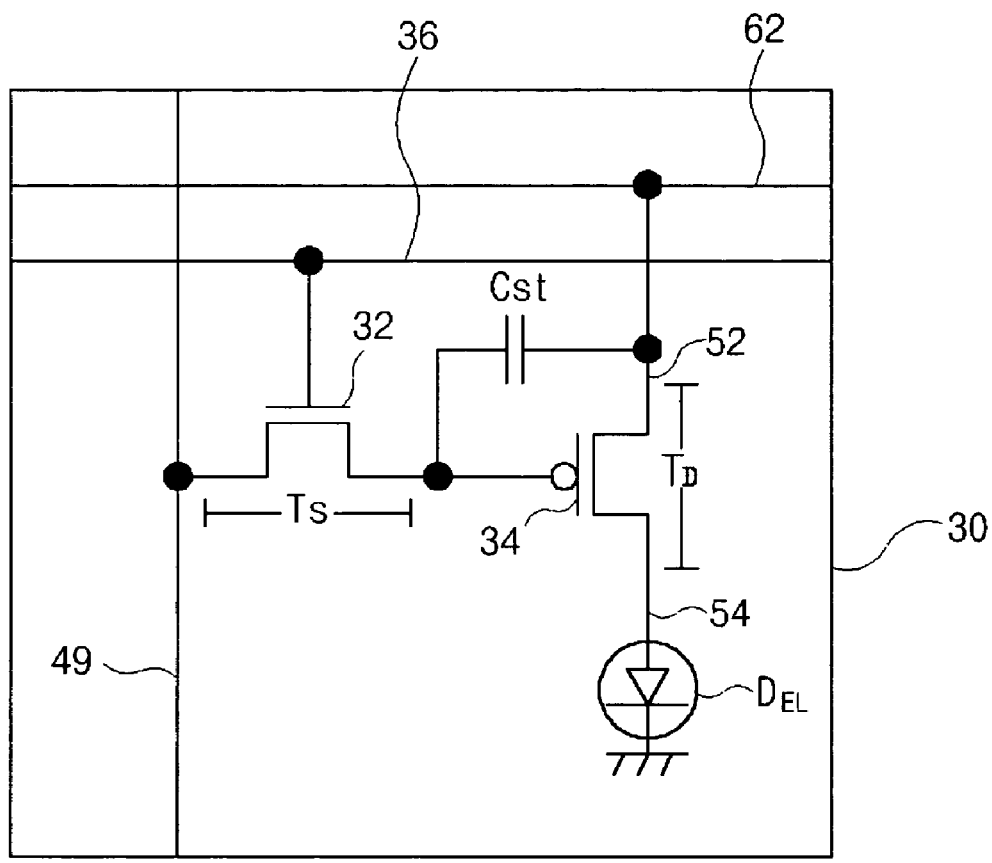
FIG. 2 is an equivalent circuit diagram of an organic electroluminescent device according to the related art.
Figure 3:
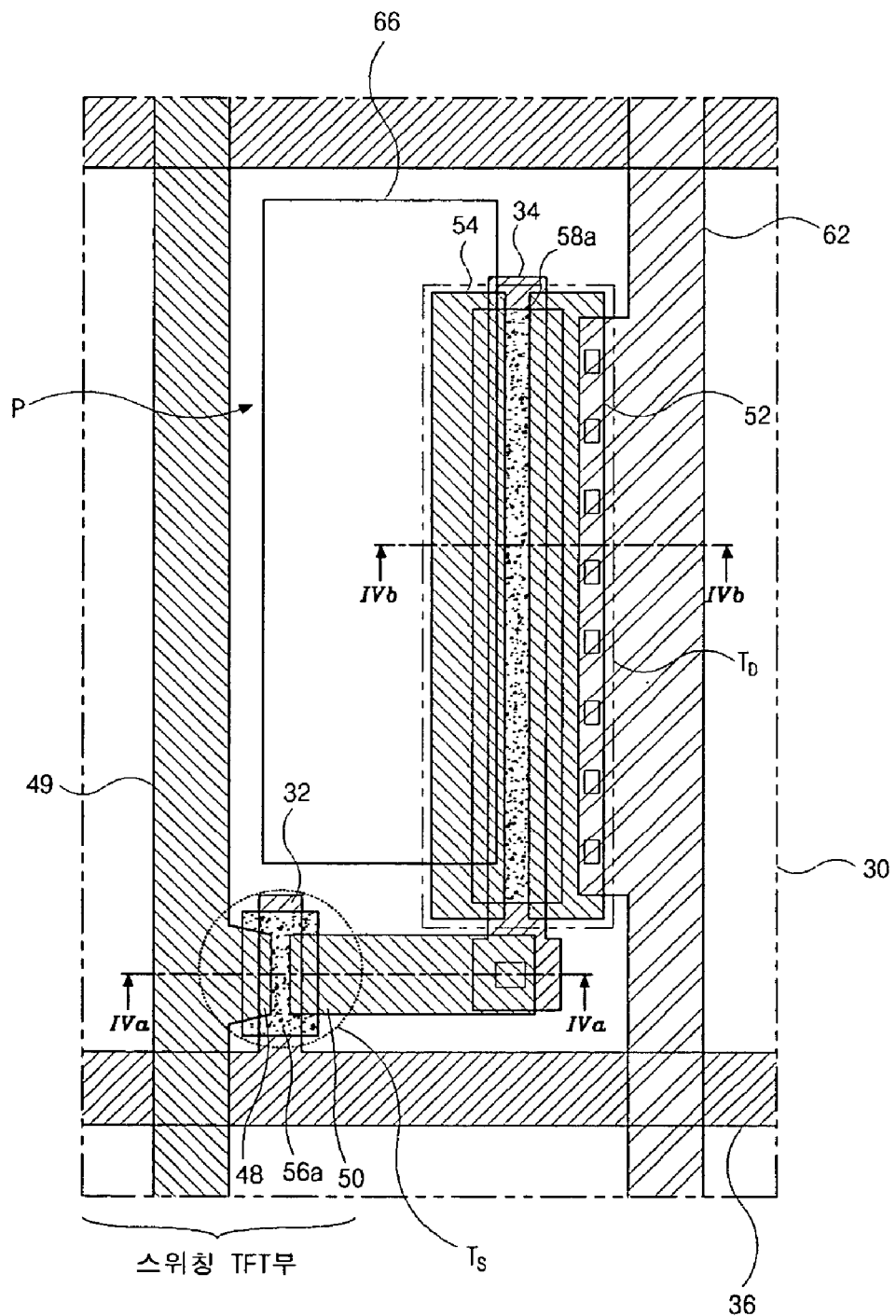
FIG. 3 is a schematic cross-sectional view illustrating a switching element and a driving element including an amorphous TFT for one pixel region of an organic electroluminescent device according to the related art.
Figure 4A:
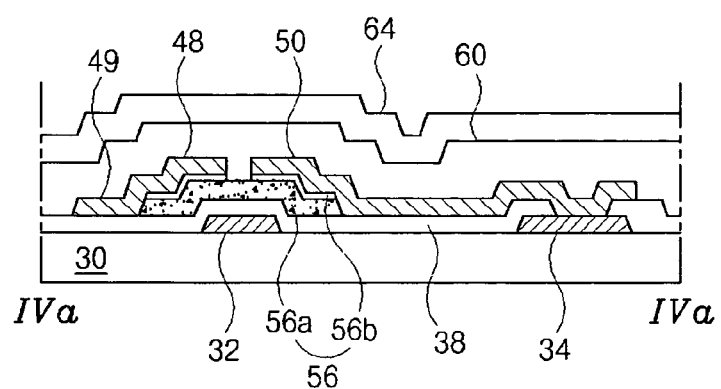
FIGS. 4A and 4B are schematic cross-sectional views taken along the lines "IVa—IVa" and "IVb—IVb" in FIG. 3, respectively.
Figure 4B:
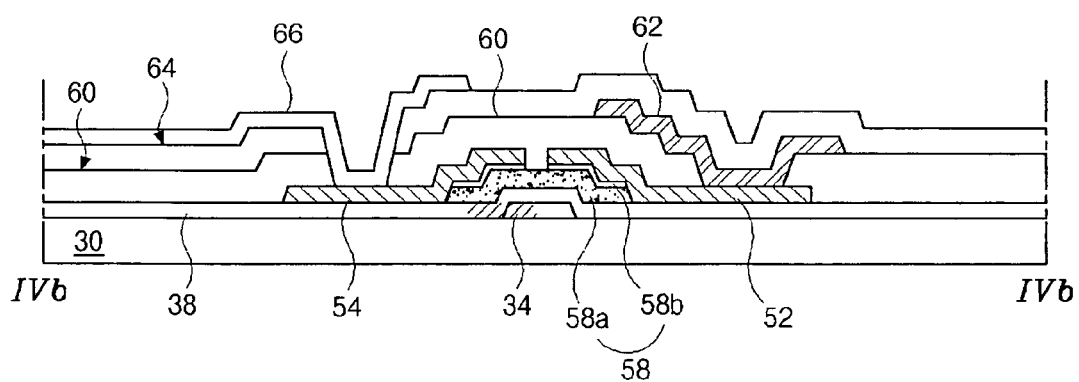
Figure 5:
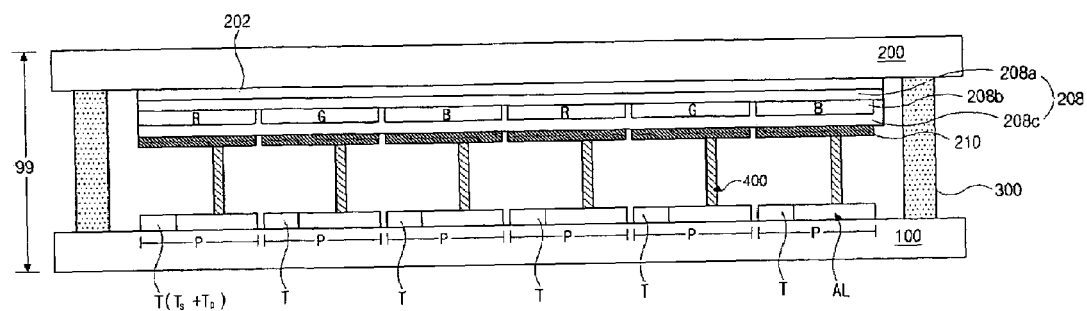
FIG. 5 is a schematic cross-sectional view illustrating a dual plate type organic electroluminescent device according to an embodiment of the present invention.

FIG. 5 is a schematic cross-sectional view illustrating a dual plate type organic electroluminescent device according to an embodiment of the present invention. In FIG. 5, a plurality of pixel regions "P" are defined in first and second substrates 100 and 200, with the first and second substrates facing to each other and spaced apart from each other. A plurality of array element layers "AL" and a plurality of thin film transistors (TFTs) "T" are formed on an inner surface of the first substrate 100. Each of array element layers "AL" and TFTs "T" are located in each of the pixel regions "P." Although not shown in FIG. 5, each of the TFTs "T" includes a switching TFT "$T_S$" and a driving element "TD." Specifically, the driving element "$T_D$" includes a plurality of driving TFTs (not shown) interconnected in parallel.

A first electrode 202 is formed on an inner surface of the second substrate 200. A plurality of electroluminescent layers 208 and a plurality of second electrodes 210 are sequentially formed on the first electrode 202 in the pixel regions "P." The electroluminescent layers 208 may separately display red, green, and blue colors for each pixel region "P." When the first electrode 202 functions as an anode, the first electrode 202 is made of a transparent conductive material such as indium tin oxide (ITO), indium zinc oxide (IZO), or the like. When the second electrode 210 functions as a cathode, the second electrode 210 may be made of an opaque (non-transparent) conductive material such as aluminum (Al), calcium (Ca), magnesium (Mg), lithium fluorine/aluminum (LiF/Al), or the like. In addition, the electroluminescent layers 208 may include a plurality of hole transporting layers 208a, a plurality of emitting layers 208b and a plurality of electron transporting layers 208c. Specifically, the hole transporting layer 208a supplies holes to the emitting layers 208b from an anode; the electron transporting layer 208c supplies electrons to the emitting layers 208b from a cathode.

Meanwhile, a connection electrode 400 electrically connects the first substrate 100 to the second substrate 200 and is located in each pixel region "P." Specifically, the second electrodes 210 and the driving element "$T_D$" can be interconnected through the connection electrode 400. In addition, the first and second substrates 100 and 200 are attached to each other with a sealant 300.

Figure 6:
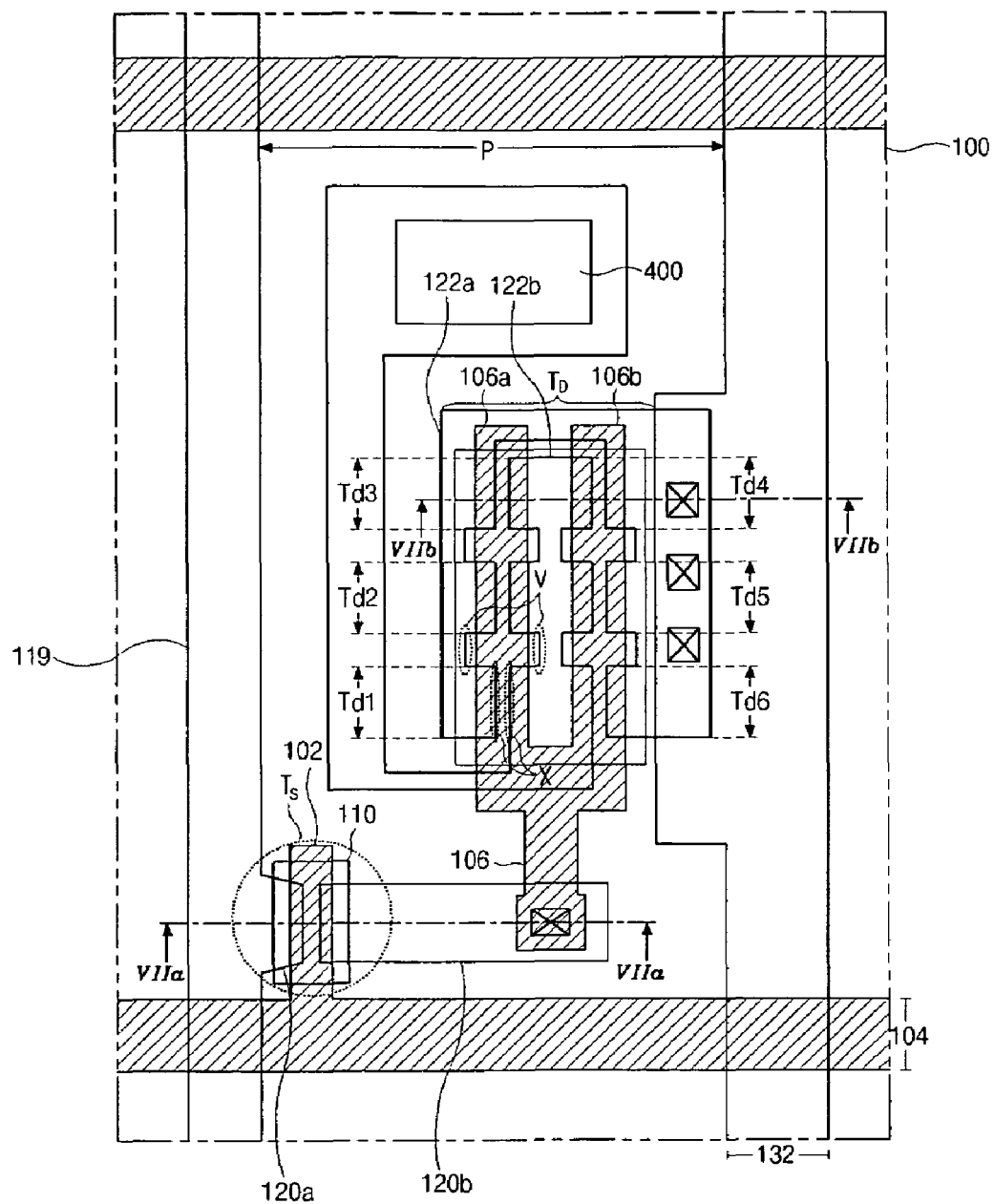
FIG. 6 is a schematic plan view illustrating a dual plate type electroluminescent device according to an embodiment of the present invention.
Figure 7A:
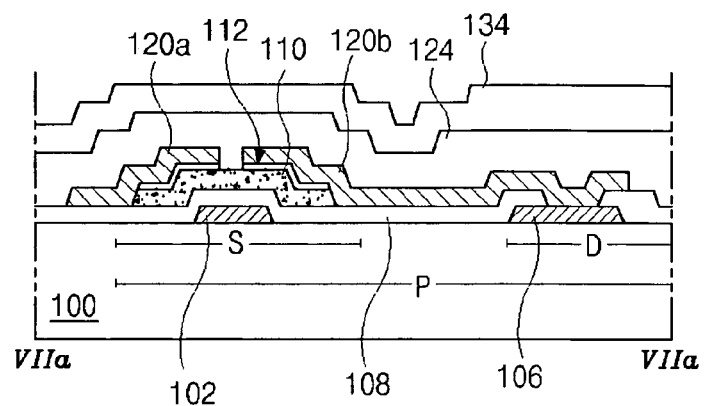
FIGS. 7A and 7B are schematic cross-sectional views taken along the lines "VIIa—VIIa" and "VIIb—VIIb" in FIG. 6, respectively.
Figure 7B:
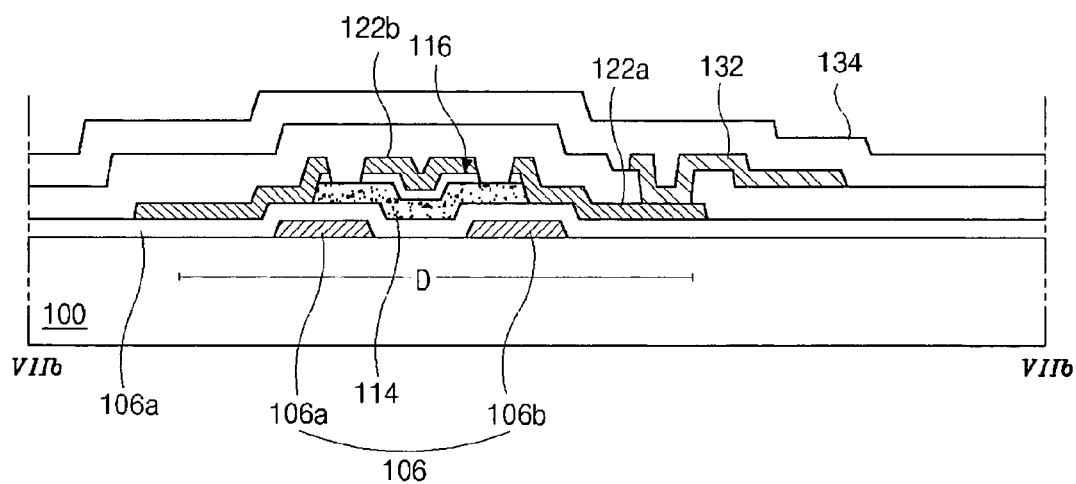

FIG. 6 is a schematic plane view illustrating a dual plate type electroluminescent device according to an embodiment of the present invention. FIGS. 7A and 7B are schematic cross-sectional views taken along the lines "VIIa—VIIa" and "VIIb—VIIb" in FIG. 6.

Referring to FIGS. 6, 7A and 7B, a gate line 104 is formed on a first substrate 100 in a first direction, a data line 119 crosses the gate line 104 in a second direction, and a pixel region "P" is defined by the gate and data lines 104 and 119. A switching TFT "$T_S$" adjacent to the crossing of the gate and data lines 104 and 119 is connected to the gate and data lines 104 and 119. A driving element "$T_D$" is connected to the switching TFT "$T_S$" and includes driving first to sixth TFTs "Td1 to Td6" interconnected in parallel. In addition, a power line 132 is formed in the second direction and is connected to the driving element "$T_D$."

A switching gate electrode 102 is formed on the first substrate 100, and a gate insulating layer 108 is formed over the first substrate 100 including the switching gate electrode 102. In addition, a switching active layer 110 is formed over the switching gate electrode 102, and switching source and drain electrodes 120a and 120b are formed on the switching active layer 110 and are spaced apart from each other. Thus, the switching TFT "$T_S$" includes the switching gate electrode 102, the switching active layer 110 and the switching source and drain electrodes 120a and 120b. The switching active layer 110 may be made of amorphous silicon material.

Still referring to FIGS. 6, 7A and 7B, a driving first and second gate electrodes 106a and 106b are formed as one body integral on the first substrate 100 and are spaced apart from each other. The driving first and second gate electrodes 106a and 106b are connected to the switching drain electrode 120b. A driving active layer 114 is formed over the driving first and second gate electrodes 106a and 106b, and the gate-insulating layer 108 is interposed between the driving first and second gate electrodes 106a and 106b and the driving active layer 114. In addition, a driving drain electrode 122b is formed between the driving first and second gate electrode 106a and 106b, and a driving source electrode 122a surrounds and is spaced apart from the driving drain electrode 122b. Thus, the driving element "$T_D$" includes the driving first and second gate electrodes 106a and 106b, the driving active layer 114, and the driving source and drain electrodes 122a and 122b. The driving drain and source electrodes 122a and 122b have uneven portions, protruding portions "X" and receded portions "V," as shown in FIG. 6. The protruding portions "X" overlap the driving first and second gate electrodes 106a and 106b, and the receded portions "V" do not overlap the driving first and second gate electrodes 106a and 106b.

FIGS. 8 to 12 are schematic plan views of a driving element having a plurality of driving TFTs in parallel with each other according to another embodiments of the present invention.

A driving first and second gate electrodes 106a and 106b as one body integral are formed on the first substrate 100 (of FIG. 6) and are spaced apart from each other. A driving drain electrode 122b is formed between the driving first and second gate electrodes 106a and 106b in a plan view. Part of the driving drain electrode 122b overlaps edge portions of the driving first and second gate electrodes 106a and 106b. A driving source electrode 122a surrounds the driving drain electrode 122b and is spaced apart from the driving drain electrode 122b. Although not shown in FIGS. 8 to 12, the driving active layer 114 (of FIG. 6) is formed over the driving first and second gate electrodes 106a and 106b. In addition, a driving element "$T_D$" includes a plurality of driving TFTs "Td."

Figure 8:
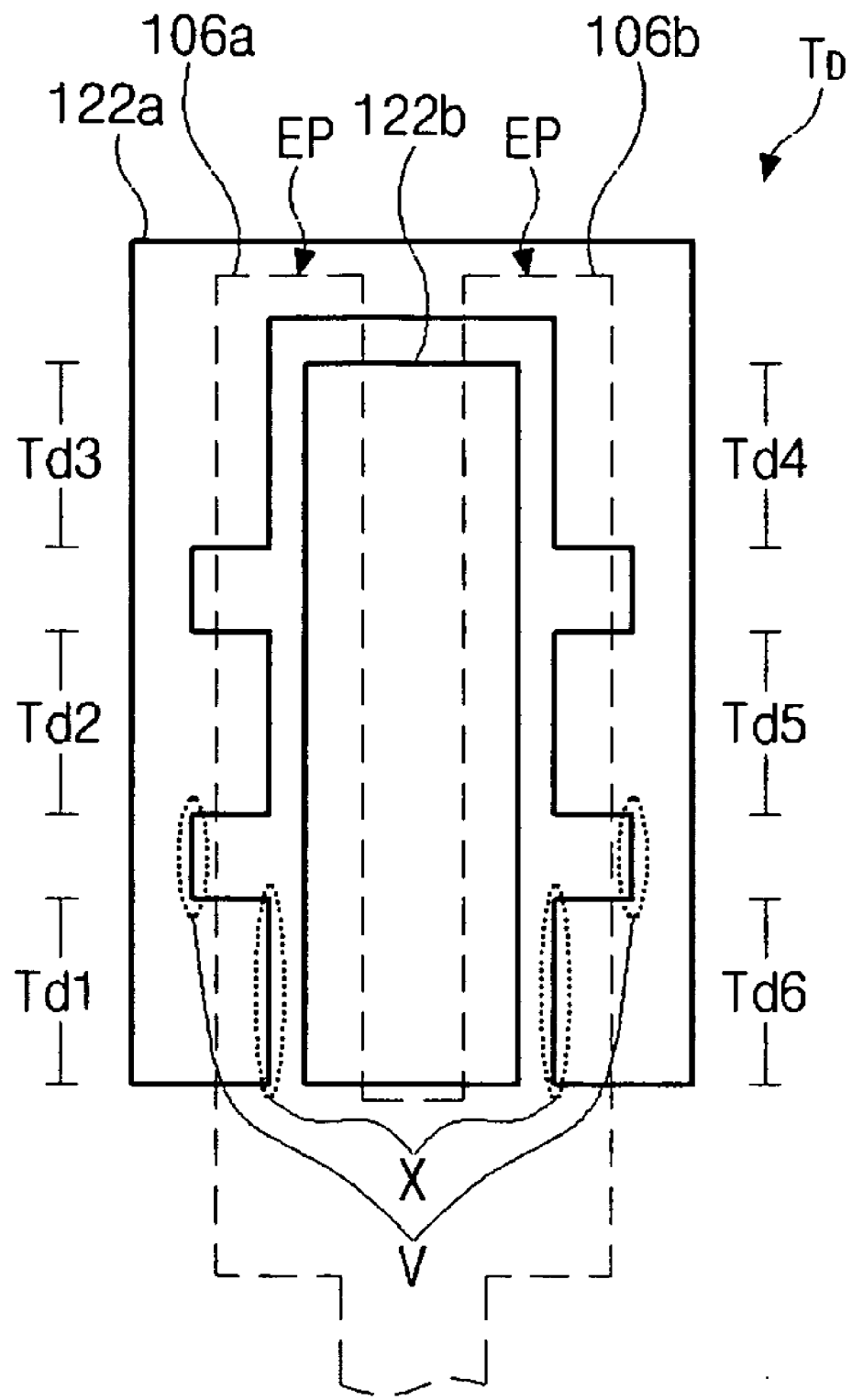
FIGS. 8 to 12 are schematic plan views of a driving element having a plurality of driving TFTs in parallel with each other according to embodiments of the present invention.

In FIG. 8, the driving source electrode 122a has uneven portions, protruding portions "X" and receded portions "V." The protruding portions "X" overlap the driving first and second gate electrodes 106a and 106b, and the receded portions "V" do not overlap the driving first and second gate electrodes 106a and 106b. In addition, a driving element "$T_D$" includes driving first to sixth TFTs "Td1" to "Td6" in FIG. 8.

Figure 9:
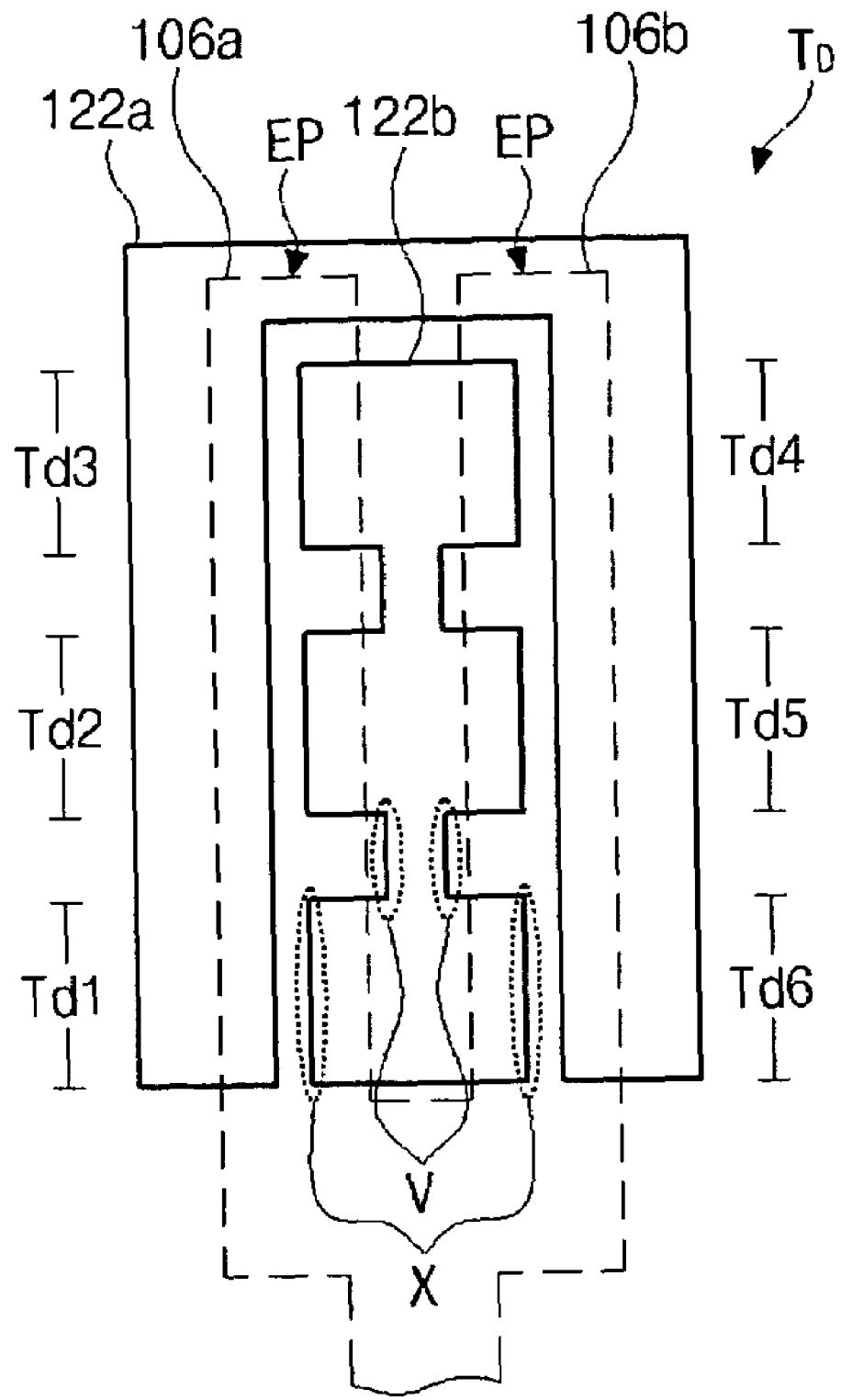

In FIG. 9, the driving drain electrode 122b has uneven portions, protruding portions "X" and receded portions "V." The protruding portions "X" overlap the driving first and second gate electrodes 106a and 106b, and the receded portions "V" do not overlap the driving first and second gate electrodes 106a and 106b. In addition, a driving element "$T_D$" includes driving first to sixth TFTs "Td1" to "Td6" in FIG. 9. In FIGS. 8, to 9, the driving first and second gate electrodes 106a and 106b have end portions "EP."

Figure 10:
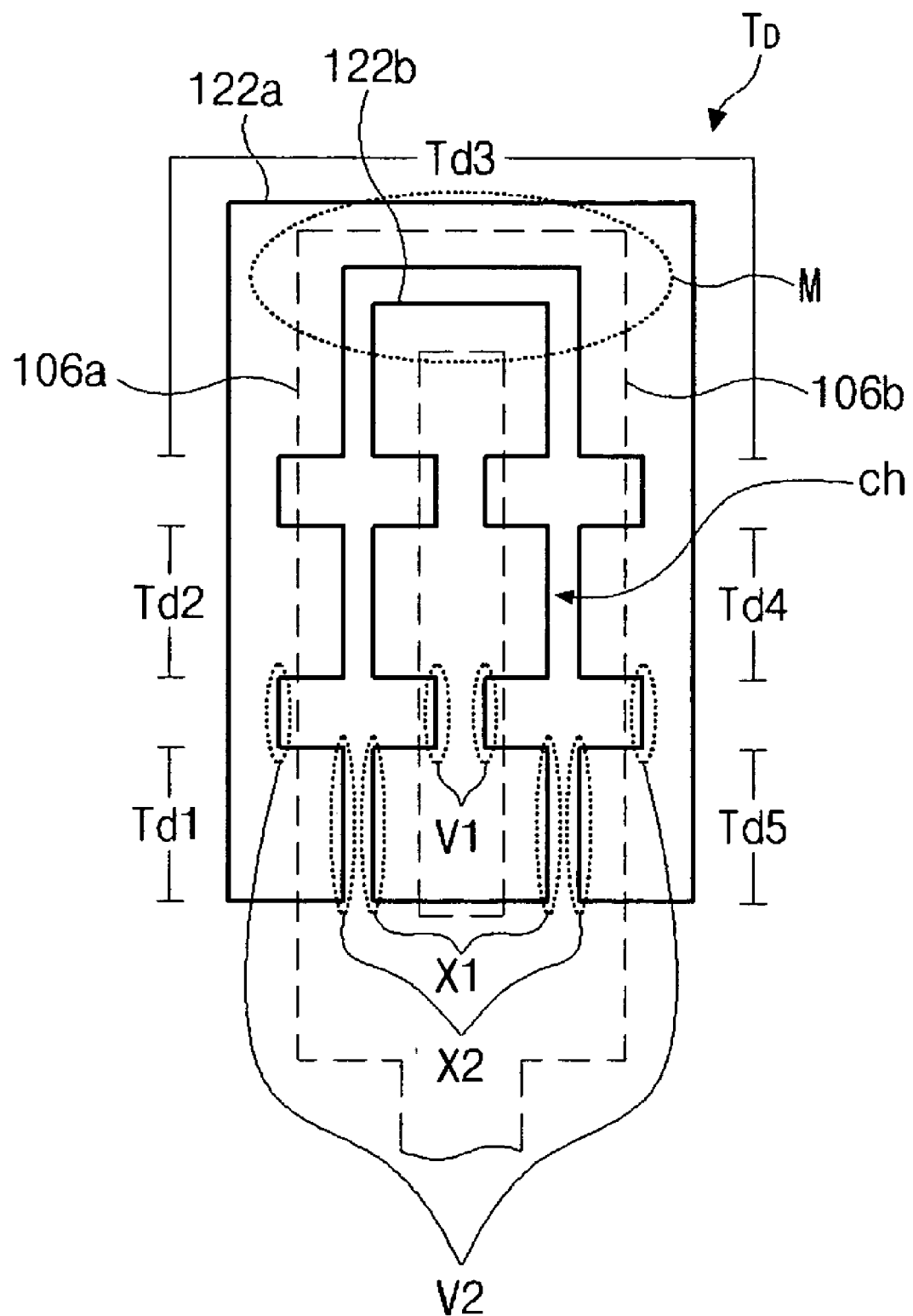

In FIG. 10, the driving drain and source electrodes 122a and 122b have first and second uneven portions. The first uneven portion of the driving drain electrode 122b has first protruding portions "X1" and first receded portions "V1," and the second uneven portion of the driving source electrode 122a has second protruding portions "X2" and second receded portions "V2." The first and second protruding portions "X1" and "X2" overlap the driving first and second gate electrodes 106a and 106b, and the first and second receded portions "V1 and V2" do not overlap the driving first and second gate electrodes 106a and 106b. The driving first and second gate electrodes 106a and 106b have a ring shape. The driving first and second gate electrodes 106a and 106b includes a connection portion "M". Therefore, the area of the active channel region "ch" becomes enlarged without additional driving TFTs. In addition, a driving element "$T_D$" includes driving first to fifth TFTs "Td1" to "Td5" in FIG. 10.

Figure 11:
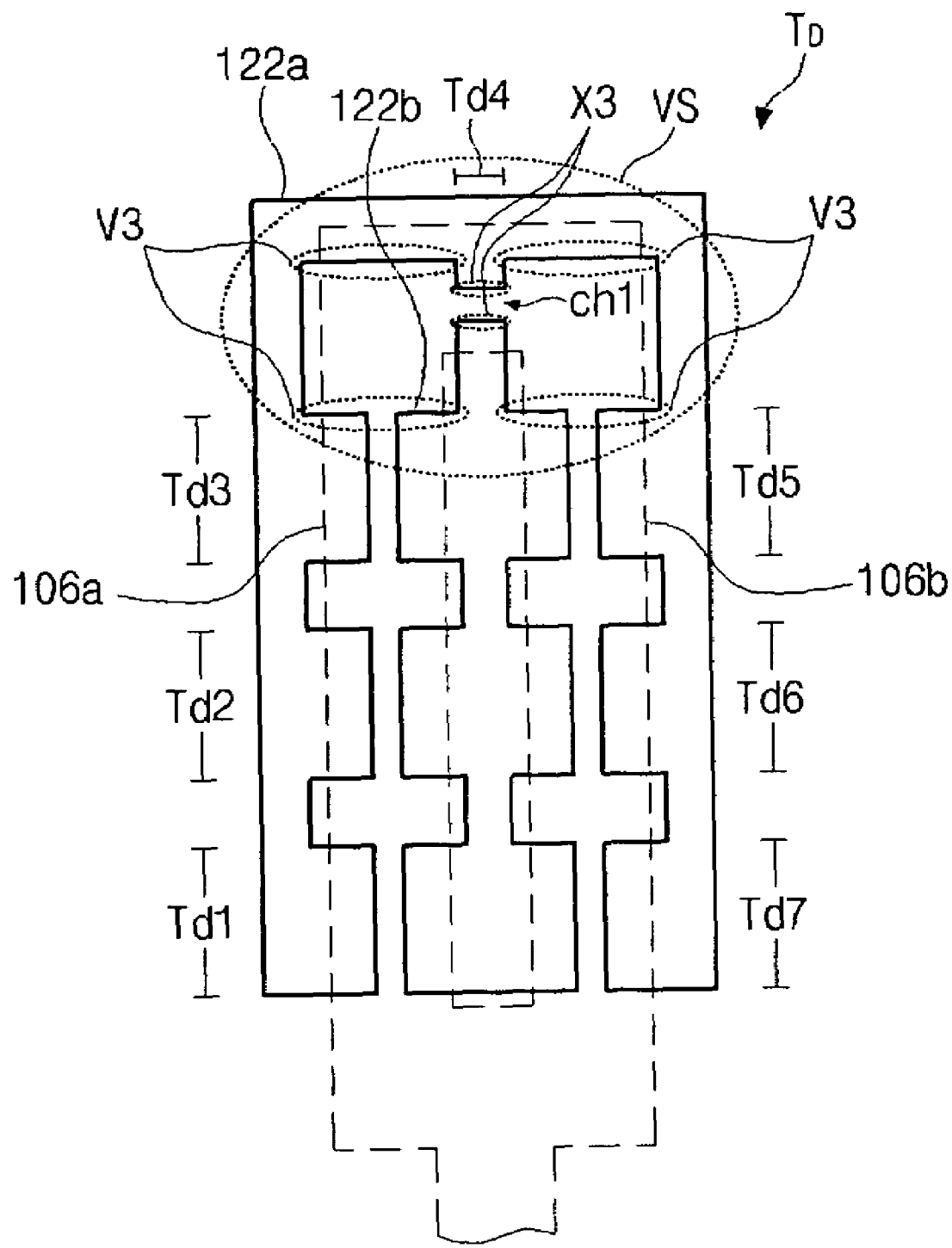

In FIG. 11, a driving element "$T_D$" further includes a third uneven portion "VS" in another facing portion of the driving drain and source electrodes 122a and 122b, and the third uneven portion "VS" has third protruding portions "X3" and third receded portions "V3." The third protruding portions "X3" overlap the driving first and second gate electrodes 106a and 106b, and part of the third receded portions "V3" do not overlap the driving first and second gate electrodes 106a and 106b. In FIG. 11, between the third protruding portions "X3" is another active channel region "ch1." In addition, a driving element "$T_D$" includes driving first to seventh TFTs "Td1" to "Td7" in FIG. 11.

Figure 12:
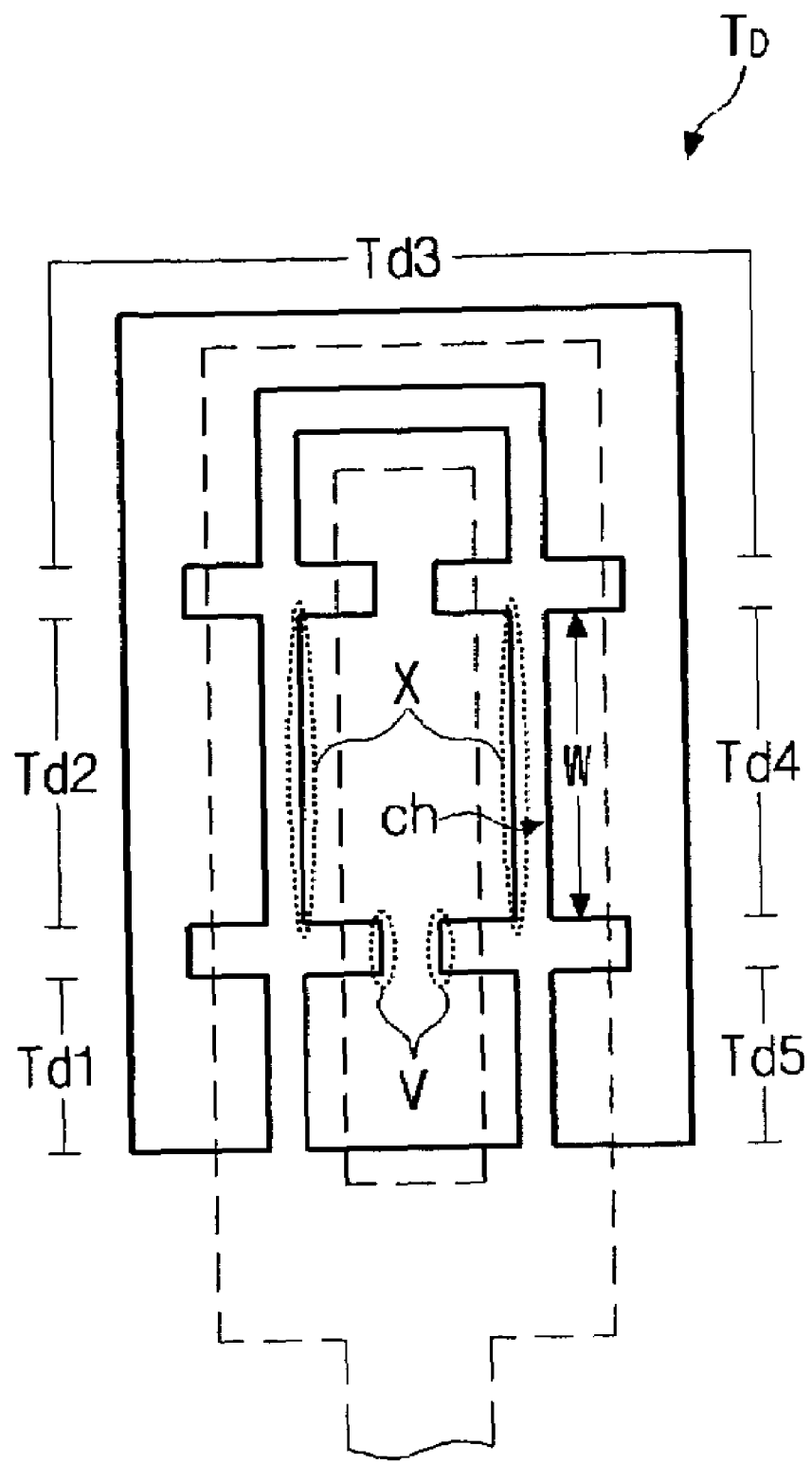

In FIG. 12, a driving element "$T_D$" includes driving first to fifth TFTs "Td1" to "Td5". The driving drain and source electrodes 122a and 122b have uneven portions, protruding portions "X" and receded portions "V," as shown in FIG. 12. A channel width "W" of the driving element "$T_D$" such as the forth driving TFT "Td4" increases by extending the corresponding protruding portions "X."

Although not shown in FIGS. 8 to 12, the driving source and drain electrodes 122a and 122b may be exchanged with each other. That is, reference number 122a can be the drain electrode and reference number 122b can be the source electrode. In particular, when the thin film transistor is n-type and a voltage level of the drain electrode is greater than a voltage level of the source electrode, the source and drain electrodes are exchanged with each other from the positions shown in FIG. 8 to 12. In such a case, a pinch off phenomenon may, however, occur in the exchanged portion of the drain electrode, and this may act as a resistance element of the channel. This is because the TFTs of an organic electroluminescent device should be driven in a saturation region. The number of the protruding and receded portions "X" and "V" determine the number of TFTs in parallel.

FIGS. 13A to 13F, 14A to 14F are schematic cross-sectional views taken along the line "VIIa—VIIa" and "VIIb—VIIb" in FIG. 6, respectively, illustrating a fabricating process of TFT array portions of an organic electroluminescent device according to an embodiment of the present invention.

A pixel region "P", a switching region "S" and a driving region "D" are defined in a first substrate 100. The switch and driving regions "S" and "D" include a switch TFT (not shown) and a driving element (not shown), respectively. A switching gate electrode 102 and a driving gate electrode 106 are formed on the first substrate 100 by depositing and patterning a metal layer such as aluminum (Al), Al alloy, tungsten (W), copper (Cu), molybdenum (Mo), titanium (Ti) or the like. Although not shown in FIGS. 13A and 14A, the switching gate electrode 102 is connected to a gate line which is formed on the first substrate 100 in a first direction. The driving gate electrode 106 includes driving first and second gate electrodes 106a and 106b in the driving region "D." The driving first and second gate electrodes 106a and 106b have end portions. It should be understood that the driving first and second gate electrodes 106a and 106b may have a ring shape all together, as shown in FIGS. 10 to 12.

Figure 13A:
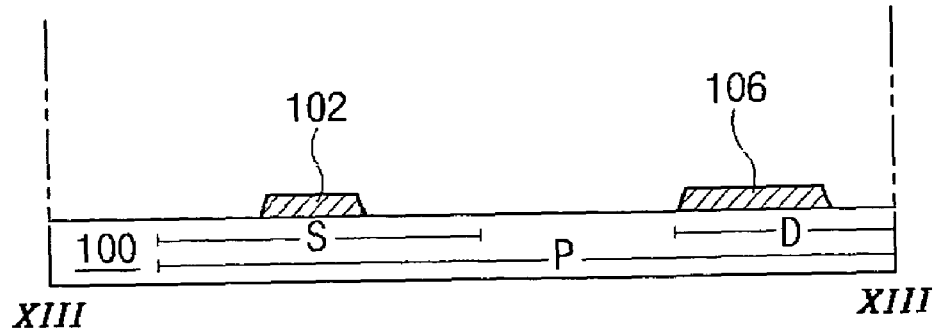
FIGS. 13A to 13F and 14A to 14F are schematic cross-sectional views taken along the lines "VIIa—VIIa" and "VIIb—VIIb" in FIG. 6, illustrating a fabricating process of TFT array portions of an organic electroluminescent device according to an embodiment of the present invention.
Figure 13B:
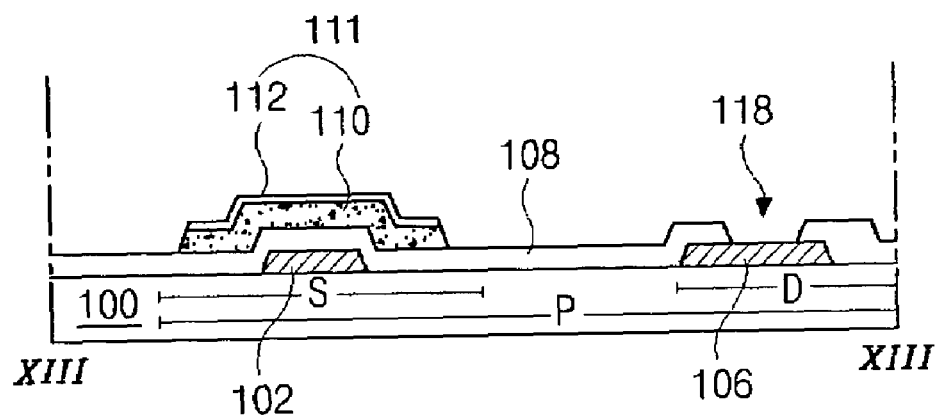
Figure 14A:
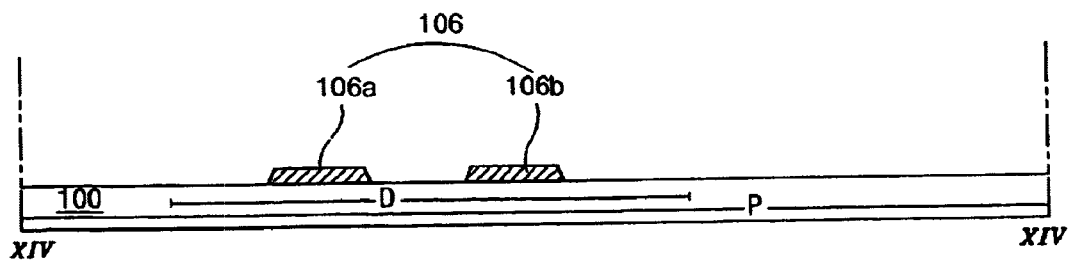
Figure 14B:
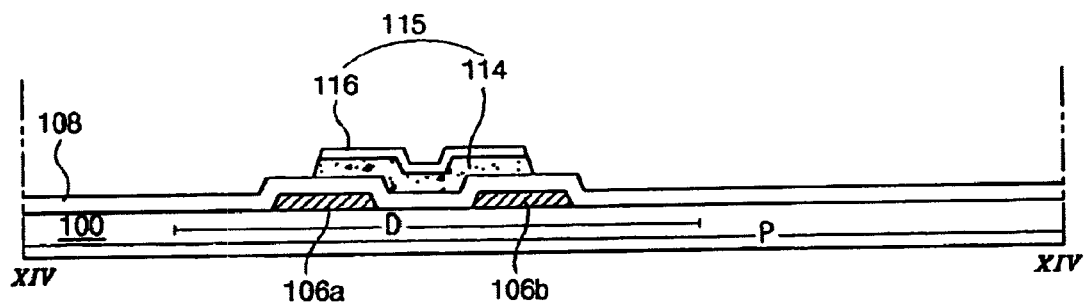

In FIGS. 13B and 14B, a gate insulating layer 108 is formed over the first substrate 100 having the switching gate electrode 102 and the driving gate electrode 106. The gate insulating layer 108, is formed by depositing an inorganic insulating material such as silicon nitride (SiNx) or silicon oxide ($SiO_2$). A switching semi-conductor layer 111 and a driving semi-conductor layer 115 are formed over the switching gate electrode 102 and driving gate electrode 106, respectively, by sequentially depositing and patterning intrinsic amorphous silicon and doped amorphous silicon. Thus, the gate insulating layer 108 is formed between the semi-conductor layers 111 and 115 and the gate electrodes 102 and 106. The switching semi-conductor layer 111 includes a switching active layer 110 and a switching ohmic contact layer 112, and the driving semi-conductor layer 115 includes a driving active layer 114 and a driving ohmic contact layer 116. In addition, the gate-insulating layer 108 has a gate contact hole 118 that exposes a portion of the driving gate electrode 106.

Figure 13C:
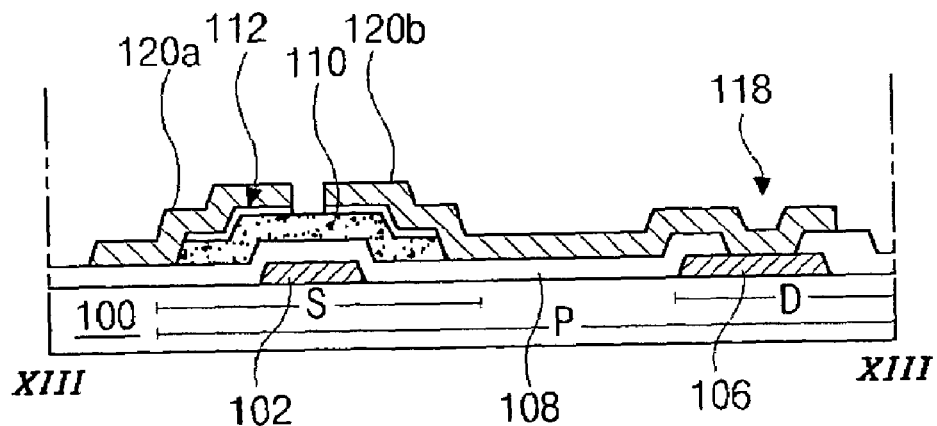
Figure 14C:
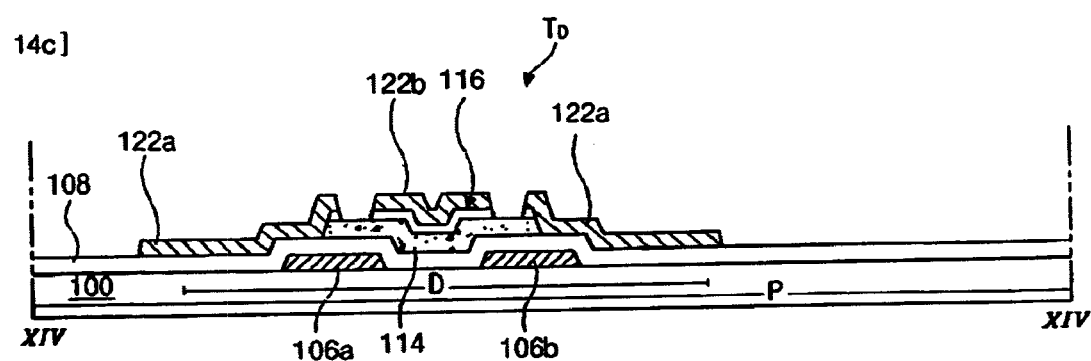

In FIGS. 13C and 14C, switching source and drain electrodes 120a and 120b and driving source and drain electrodes 122a and 122b are formed on the switching semi-conductor layer 111 and driving semi-conductor layer 115, respectively, by depositing and patterning a metal layer. Specifically, the switching source and drain electrodes 120a and 120b contact the switching ohmic contact layer 112, and the driving source and drain electrodes 122a and 122b contact the driving ohmic contact layer 116. The driving drain electrode 122b is located between the driving first and second gate electrodes 106a and 106b in a plan view. The driving source electrode 122a is spaced apart from the driving drain electrode 122b and surrounds the driving drain electrode 122b. In addition, the driving gate electrode 106 is connected to the switching drain electrode 120b via the gate contact hole 118.

Although not shown in FIGS. 13C and 14C, in order to provide a driving element "$T_D$" having a plurality of driving TFTs in parallel with each other, at least one of the driving source and drain electrodes 122a and 122b has an uneven portion. The uneven portion includes protruding portions that overlap the driving first and second gate electrodes 106a and 106b and receded portions that do not overlap the driving first and second gate electrodes 106a and 106b. In addition, a portion of the switching active layer 110 between the switching source and drain electrodes 120a and 120b, and a portion of the driving active layer 114 between the driving source and drain electrodes 122a and 122b are exposed by etching the switching ohmic contact layer 112 and driving ohmic contact layer 116, respectively.

Figure 13D:
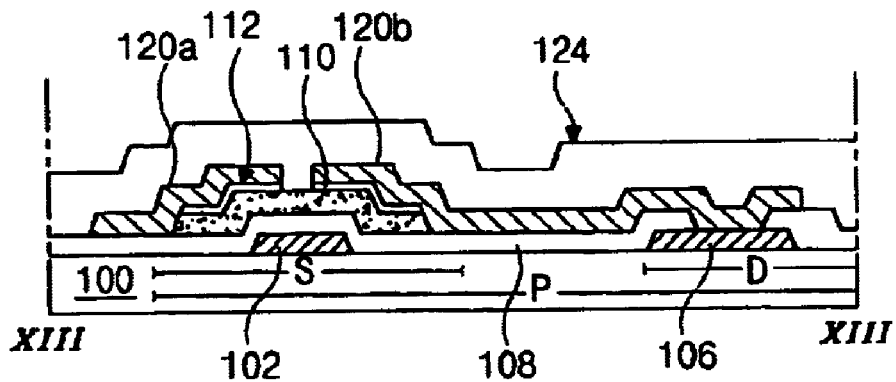
Figure 14D:
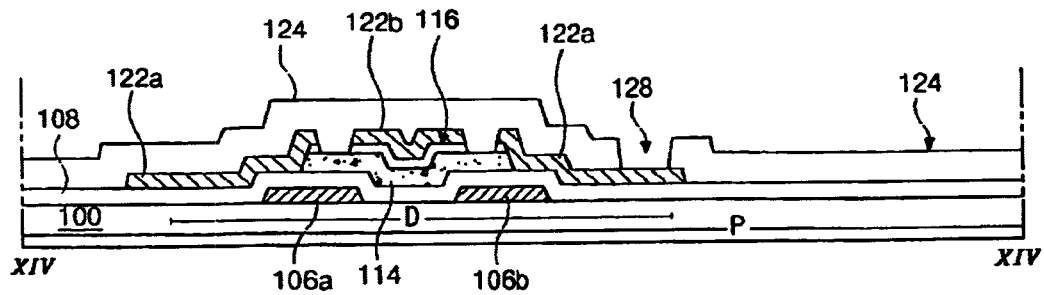

In FIGS. 13D and 14D, a first passivation layer 124 is formed over the first substrate 100 including the switching source and drain electrodes 120a and 120b, and the driving source and drain electrode 122a and 122b. The first passivation layer 124 has a first contact hole 128 that exposes an edge portion of the driving source electrode 122a.

Figure 13E:
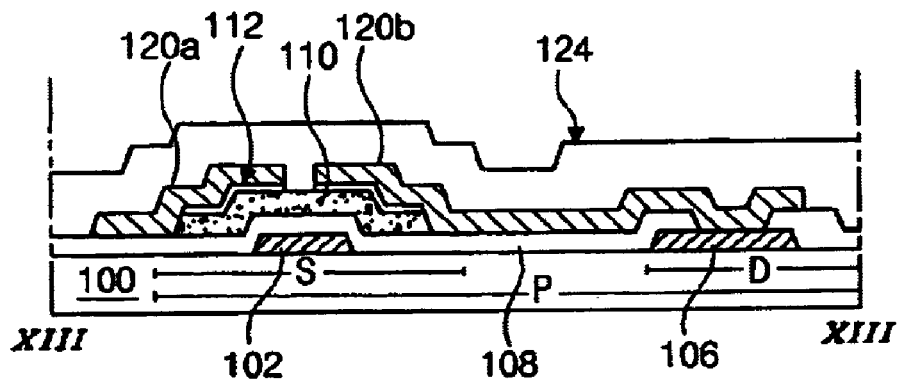
Figure 14E:
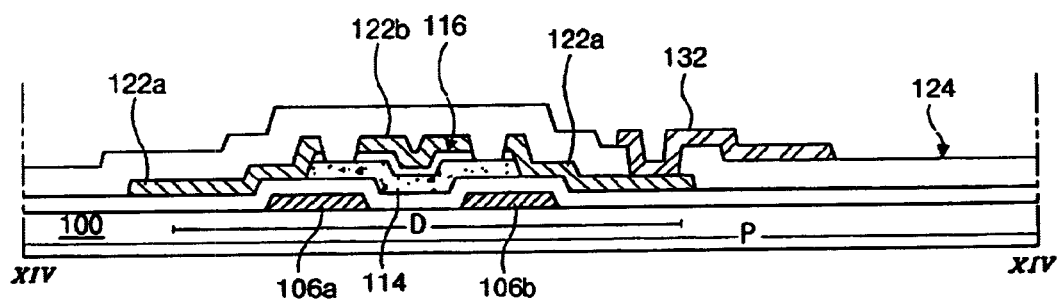

In FIGS. 13E and 14E, a power line 132 is formed by depositing and patterning a conductive layer and is connected to the driving source electrode 122a. Although not shown in FIGS. 13E and 14E, the power line 132 may be simultaneously formed with the gate electrode 106.

Figure 13F:
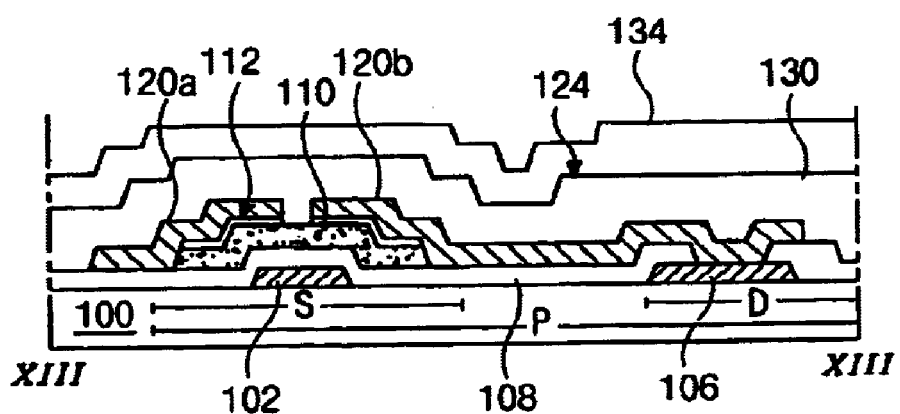
Figure 14F:
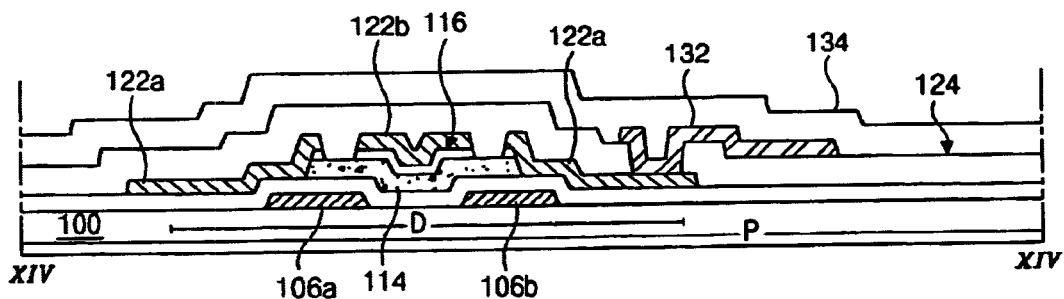

In FIGS. 13F and 14F, a second passivation layer 134 is formed by depositing an inorganic insulating material such as silicon nitride (SiNx) or silicon oxide ($SiO_2$) or by coating an organic insulating material such as benzocylcobutene (BCB) or acrylic resin. Although not shown in FIGS. 13F and 14F, the second passivation layer 134 may have a second contact hole through which the driving drain electrode 122b is connected to the connection electrode (of FIG. 6).

An organic ELD according to the present invention has several advantages. First, because the organic ELD is a top emission type, a high aperture ratio can be obtained. Second, because an array element layer including a thin film transistor and an organic EL diode are formed on their respective substrates, undesirable effects due to a fabricating process of the organic EL diode can be prevented, thereby improving the overall production yield. Third, Since the plurality of thin film transistors used in the organic electroluminescent device are interconnected in parallel, current stress can be distributed over the entire thin film transistors. Therefore, the current stress does not negatively affect the activity of the driving element, thereby providing a high image quality.

It will be apparent to those skilled in the art that various modifications and variations can be made in the organic electroluminescent device and fabricating method thereof of the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
   a gate line and a data line on a substrate, the data line crossing the gate line;
   a switching element connected to the gate line and the data line;
   a driving element having a plurality of thin film transistors interconnected in parallel, the driving element being connected to the switching element; and
   an organic electroluminescent diode connected to the driving element,
   wherein the driving element includes first and second gate electrodes, an active layer over the first and second gate electrodes, a drain electrode between the first and second gate electrodes, and a source electrode substantially surrounding the drain electrode.

2. The device according to claim 1, wherein the drain electrode has an uneven portion, the uneven portion including a protruding portion and a receded portion such that the protruding portion overlaps the first and second gate electrodes and the receded portion does not overlap the first and second gate electrodes.

3. The device according to claim 1, further comprising a power line connected to the driving element.

4. The device according to claim 1, wherein the driving element includes amorphous silicon thin film transistors.

5. The device according to claim 1, wherein the source electrode has an uneven portion, the uneven portion including a protruding portion and a receded portion such that the protruding portion overlaps the first and second gate electrodes and the receded portion does not overlap the first and second gate electrodes.

6. The device according to claim 5, wherein a channel width of each thin film transistor increases by extending the corresponding protruding portion.

7. The device according to claim 1, wherein the drain and source electrodes have uneven portions, the uneven portions including a protruding portion and a receded portion such that the protruding portion overlaps the first and second gate electrodes and the receded portion does not overlap the first and second gate electrodes.

8. The device according to claim 7, further comprising a third uneven portion, the third uneven portion including a protruding portion and a receded portion such that the protruding portion overlaps the first and second gate electrodes and the receded portion does not overlap the first and second gate electrodes.

9. The device according to claim 1, wherein each of the driving element includes an n-type thin film transistor.

10. The device according to claim 9, wherein a voltage level of the drain electrode is greater than a voltage level of the source electrode.

11. The device according to claim 1, wherein the first and second gate electrodes are connected to each other.

12. The device according to claim 11, wherein each of the first and second gate electrodes has end portions.

13. The device according to claim 11, wherein the first and second gate electrodes have a ring shape.

14. An organic electroluminescent device, comprising:
first and second substrates facing each other and spaced apart from each other;
a gate line and a data line on the first substrate, the data line crossing the gate line;
a switching element connected to the gate line and the data line;
a driving element having a plurality of thin film transistors interconnected in parallel, the driving element being connected to the switching element;
an organic electroluminescent diode on the second substrate; and
a connection electrode electrically connecting the first substrate to the second substrate,
wherein the driving element includes first and second gate electrodes, an active layer over the first and second gate electrodes, a drain electrode between the first and second gate electrodes; and a source electrode substantially surrounding the drain electrode.

15. The device according to claim 14, wherein the organic electroluminescent diode includes a first electrode on the second substrate, an electroluminescent layer on the first electrode and a second electrode on the electroluminescent layer.

16. The device according to claim 14, wherein the connection electrode is connected to the driving element and the second electrode.

17. The device according to claim 14, wherein the first electrode functions as an anode, the second electrode functions as a cathode.

18. The device according to claim 17, wherein the first electrode includes one of indium tin oxide (ITO) and indium zinc oxide (IZO).

19. The device according to claim 17, wherein the second electrode includes one of aluminum (Al), calcium (Ca), magnesium (Mg) and lithium fluorine/aluminum (LiF/Al).

20. A method of fabricating an organic electroluminescent device, comprising: forming a gate line on a substrate;
forming a switching element connected to the gate line;
forming a driving element connected to the switching element, the driving element having a plurality of thin film transistors interconnected in parallel;
forming a data line, the data line crossing the gate line and connected to the switching element; and
forming an organic electroluminescent diode connected to the driving element,
wherein forming the driving element having the plurality of the thin film transistors includes:
forming first and second gate electrodes;
forming an active layer over the first and second gate electrodes;
forming a drain electrode between the first and second gate electrodes; and
forming a source electrode substantially surrounding the drain electrode.

21. The method according to claim 20, wherein the drain electrode has an uneven portion, the uneven portion including a protruding portion and a receded portion such that the protruding portion overlaps the first and second gate electrodes and the receded portion does not overlap the first and second gate electrodes.

22. The method according to claim 20, further comprising forming a power line connected to the driving element.

23. The method according to claim 20, wherein the plurality of the thin film transistors are amorphous silicon thin film transistors.

24. The method according to claim 20, wherein the source electrode has an uneven portion at portions facing the drain electrode and the uneven portion has a protruding portion and a receded portion such that the protruding portion overlaps the first and second gate electrodes and the receded portion does not overlap the first and second gate electrodes.

25. The method according to claim 24, wherein a channel width of each thin film transistor increases by extending the corresponding protruding portion.

26. The method according to claim 20, wherein the drain and source electrodes have uneven portions, the uneven portions including protruding portions and receded portions such that the protruding portions overlap the first and second gate electrodes and the receded portions do not overlap the first and second gate electrodes.

27. The method according to claim 26, further comprising a third uneven portion, the third uneven portion including a protruding portion and a receded portion such that the protruding portion overlaps the first and second gate electrodes and the receded portion does not overlap the first and second gate electrodes.

28. The method according to claim 20, wherein the driving element includes an n-type thin film transistor.

29. The method according to claim 28, wherein a voltage level of the drain electrode is greater than a voltage level of the source electrode.

30. The method according to claim 20, wherein the first and second gate electrodes are connected to each other.

31. The method according to claim 30, wherein each of the first and second gate electrodes has an end portion.

32. The method according to claim 30, wherein the first and second gate electrodes have a ring shape.

* * * * *